US011501809B1

(12) United States Patent
Mangal et al.

(10) Patent No.: US 11,501,809 B1
(45) Date of Patent: Nov. 15, 2022

(54) CONTENTION-ADAPTED READ-WRITE PULSE GENERATION CIRCUITRY

(71) Applicant: Arm Limited, Cambridge (GB)

(72) Inventors: Sanjay Mangal, Austin, TX (US); Bikas Maiti, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/348,209

(22) Filed: Jun. 15, 2021

(51) Int. Cl.
| G11C 8/14 | (2006.01) |
| G11C 8/08 | (2006.01) |
| G11C 7/12 | (2006.01) |
| G06F 13/16 | (2006.01) |
| G11C 7/18 | (2006.01) |
| G11C 7/10 | (2006.01) |

(52) U.S. Cl.
CPC ............ G11C 8/14 (2013.01); G06F 13/1605 (2013.01); G11C 7/12 (2013.01); G11C 7/18 (2013.01); G11C 8/08 (2013.01); *G11C 7/1075* (2013.01)

(58) Field of Classification Search
CPC .... G11C 8/14; G11C 7/12; G11C 7/18; G11C 8/08; G11C 7/1075; G06F 13/1605
USPC ......................................................... 711/149
See application file for complete search history.

(56) References Cited

U.S. PATENT DOCUMENTS

| 4,910,655 | A  | * | 3/1990  | Ashkin ............... G06F 12/0661 |
|           |    |   |         | 711/E12.086 |
| 8,243,497 | B1 | * | 8/2012  | Pellizzer ............ G11C 13/0033 |
|           |    |   |         | 365/115 |
| 9,208,858 | B1 | * | 12/2015 | Lin .......................... G11C 8/16 |
| 11,017,879 | B1 | * | 5/2021 | Rehmeyer .............. G11C 29/78 |
| 2002/0065997 | A1 | * | 5/2002 | Hsu ...................... G11C 7/1075 |
|              |    |   |        | 711/158 |
| 2002/0188829 | A1 | * | 12/2002 | Senter .................. G06F 9/3004 |
|              |    |   |         | 712/E9.046 |
| 2008/0198681 | A1 | * | 8/2008 | Kenkare ................. G11C 8/10 |
|              |    |   |        | 365/230.05 |
| 2011/0122687 | A1 | * | 5/2011 | Kwon ............... G11C 16/3418 |
|              |    |   |        | 365/185.02 |
| 2012/0287733 | A1 | * | 11/2012 | van Winkelhoff ... G11C 7/1075 |
|              |    |   |         | 365/189.16 |
| 2016/0240244 | A1 | * | 8/2016 | Shankar ................ G11C 11/419 |
| 2016/0337731 | A1 | * | 11/2016 | Graves ..................... G02B 6/43 |
| 2018/0308542 | A1 | * | 10/2018 | Kim ...................... G11C 7/1006 |
| 2019/0130965 | A1 | * | 5/2019 | Siddiqui .............. G11C 11/419 |
| 2021/0125645 | A1 | * | 4/2021 | Koudar .................... G11C 8/10 |

* cited by examiner

*Primary Examiner* — Fernando Hidalgo
(74) *Attorney, Agent, or Firm* — Pramudji Law Group PLLC; Ari Pramudji

(57) ABSTRACT

Various implementations described herein refer to a device having an address bus that provides multi-port addresses from multiple ports including a first address from a first port and a second address from a second port. The device may have column contention-detection circuitry that receives the multi-port addresses from the address bus, compares the first address from the first port with the second address from the second port and provides a contention adjustment signal based on the comparison between the first address and the second address. The device may have bitline collision circuitry that receives the contention adjustment signal, senses wire-to-wire variation related to bitline coupling effects and provides a bitline collision signal based on sensing the bitline coupling effects.

20 Claims, 4 Drawing Sheets

300

310 — use an address bus to provide multi-port addresses from multiple ports including a first address from a first port and a second address from a second port

320 — provide column contention-detection circuitry to receive the multi-port addresses from the address bus, compare the first address from the first port with the second address from the second port and provide a contention adjustment signal based on the comparison between the first address and the second address

330 — provide bitline collision circuitry to receive the contention adjustment signal, sense wire-to-wire variation related to bitline coupling effects and provide a bitline collision signal based on sensing the bitline coupling effects

340 — provide memory circuitry to receive an external clock pulse, receive the bitline collision signal and adjust an internal clock pulse based on the bitline collision signal.

410 — use an address bus to provide multi-port addresses from multiple ports including a first address from a first port and a second address from a second port

420 — provide row contention-detection circuitry to receive the multi-port addresses from the address bus, compare the first address from the first port with the second address from the second port and provide a contention adjustment signal based on the comparison between the first address and the second address

430 — provide wordline collision circuitry to receive the contention adjustment signal, sense wire-to-wire variation related to wordline coupling effects and provide a wordline collision signal based on sensing the wordline coupling effects

440 — provide memory circuitry to receive an external clock pulse, receive the wordline collision signal and adjust an internal clock pulse based on the wordline collision signal

FIG. 4

CONTENTION-ADAPTED READ-WRITE PULSE GENERATION CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, dual-port bitcells typically have two-port wordlines running next to each other, which can degrade performance of read/write operations due to adverse wire-to-wire coupling. These dual-port bitcells also use multiple bitlines close to the two-port wordlines that run nearly adjacent to each other. Unfortunately, performance related to write-bitline-coupling to read-bitline-coupling can adversely impact read operations, which can result in lowering yield and/or degrade power, performance and area (PPA). Thus, there exists a need to improve circuit designs that reduce wire-to-wire coupling effects.

BRIEF DESCRIPTION OF THE DRAWINGS

Implementations of various memory layout schemes and techniques are described herein with reference to the accompanying drawings. It should be understood, however, that the accompanying drawings illustrate only various implementations described herein and are not meant to limit embodiments of various techniques described herein.

FIG. 3 illustrates a process diagram of a method for providing column contention-detection circuitry in accordance with various implementations described herein.

FIG. 4 illustrates a process diagram of a method for providing row contention-detection circuitry in accordance with various implementations described herein.

DETAILED DESCRIPTION

Various implementations described herein refer to contention-detection schemes and techniques for supporting contention-adapted read-write pulse generation applications in reference to physical circuit designs. Various applications related to contention-adapted read-write pulse generation circuitry may be used to improve yield and power, performance and area (PPA) in memory based architecture, such as e.g., random access memory related application, e.g., including static RAM (SRAM) based applications Various implementations described herein provide for novel circuitry that tracks the variation in coupling effects in accordance with memory size and various other factors related to read/write pulses for adjusting the self-time pulse (STP) based on port-access contention and degradation mechanisms. Various implementations described herein may also be used to target multi-port memory applications so as to improve yield and/or PPA.

Various implementations of providing various contention-detection circuitry will be described herein with reference to FIGS. 1-4.

Figure 1:
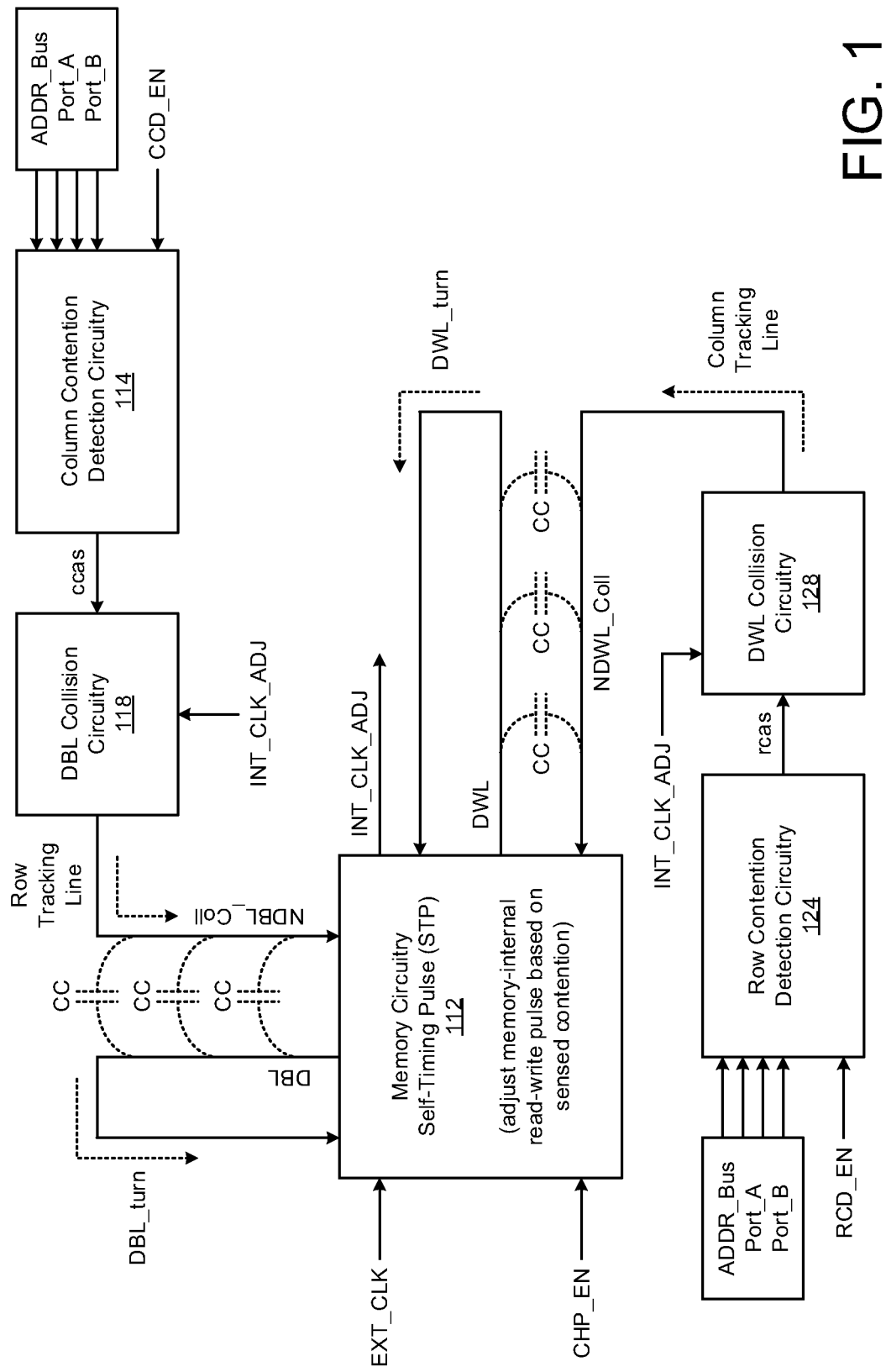
FIG. 1 illustrates a diagram of contention-adapted read-write pulse generation circuitry in accordance with various implementations described herein.

FIG. 1 illustrates a schematic diagram 100 of contention-detection circuitry 104 in accordance with various implementations described herein. In some implementations, the contention-detection circuitry 104 may be referred to as contention-adapted read-write pulse generation circuitry that is configured for various contention-detection applications.

In various implementations, the contention-detection circuitry may be implemented as a system or a device having various integrated circuit (IC) components that are arranged and coupled together as an assemblage or a combination of parts that provide for physical circuit designs and related structures. In some instances, a method of designing, providing, fabricating and/or manufacturing the contention-detection circuitry as an integrated system or device may involve use of various IC circuit components described herein so as to thereby implement various related fabrication schemes and techniques associated therewith. Also, the contention-detection circuitry may be integrated with computing circuitry and components on a single chip, and further, the contention-detection circuitry may be implemented and/or incorporated in various embedded systems for automotive, electronic, mobile, server and also Internet-of-things (IoT) applications, including remote sensor nodes.

As shown in FIG. 1, the contention-detection circuitry 104 may be implemented with contention-adapted read-write pulse generation circuitry and architecture configured for various contention-detection applications. In some implementations, the contention-adapted read-write pulse generation circuitry may have row/column contention-detection circuitry for row/column tracking as applied to memory circuitry 112. The contention-adapted read-write pulse generation circuitry has column contention-detection circuitry 114 as a first component for row tracking of the memory circuitry 112, and the contention-adapted read-write pulse generation circuitry also has row contention-detection circuitry 124 as a second component for column tracking of the memory circuitry 112.

The contention-detection circuitry 104 may have an address bus (ADDR_Bus) that provides multi-port addresses from multiple ports including, e.g., a first address from a first port (Port_A) and a second address from a second port (Port_B). The multi-port addresses may be used to access data stored in the memory circuitry 112, which may be referred to as self-timing pulse (STP) based memory. The memory circuitry 112 may receive a chip enable signal (CHP_EN) and receive an external clock pulse signal (EXT_CLK). In some instances, the memory circuitry 112 may receive receive a dummy bitline collision signal (NDBL_Coll), receive a dummy wordline collision signal (NDWL_Coll) and adjust an internal clock pulse so as to provide an adjusted internal clock pulse (INT_CLK_ADJ) based on the dummy bitline collision signal (NDBL_Coll) and/or the dummy wordline collision signal (NDWL_Coll). Also, in various instances, the memory circuitry 112 may be configured to adjust a memory-internal read-write pulse based on sensed contention between a dummy bitline (DBL) and a row tracking line (RTL) and/or based on sensed contention between a dummy wordline (DWL) and a column tracking line (CTL). Also, the sensed contention may refer to sensing coupling effects related to tracking wire-to-wire coupling-capacitance (CC) variation.

The column contention-detection circuitry 114 may receive multi-port addresses from the address bus (ADDR_Bus), compare the first address from the first port (Port_A) with the second address from the second port (Port_B), and then provide a column contention adjustment signal (ccas) based on a comparison between the first address and the second address. Also, the column contention-detection circuitry may receive a column contention-detection enable signal (CCD_EN) and then provide the column contention adjustment signal (ccas) based on the column contention-detection enable signal (CCD_EN) and/or based on the comparison between the first address and the second address. In some instances, the column contention adjustment signal (ccas) may refer to a contention-adapted read-write pulse adjustment signal.

The contention-detection circuitry 104 may have dummy bitline collision circuitry 118 that receives column contention adjustment signal (ccas), senses wire-to-wire variation related to dummy bitline (DBL) coupling effects, and provides a dummy bitline collision signal (NDBL_Coll) based on sensing the dummy bitline (DBL) coupling effects. The dummy bitline collision circuitry 118 may receive an adjusted internal clock pulse (INT_CLK_ADJ) and then provide the dummy bitline collision signal (NDBL_Coll) based on sensing the dummy bitline (DBL) coupling effects between the dummy bitline (DBL) and the row tracking line (RTL). In some instances, sensed contention may refer to sensing coupling effects related to tracking wire-to-wire coupling-capacitance (CC) variation between the DBL and the RTL. Also, the DBL may provide a dummy bitline turn signal (DBL_turn) that returns the DBL to the memory circuitry 112 for tracking other DBL sensing effects.

In some implementations, the dummy bitline collision circuitry 118 may be coupled to the memory circuitry 112 with a row tracking line (RTL) that is disposed proximate (or near, or adjacent) to a dummy bitline (DBL) associated with the dummy bitline (DBL) coupling effects. In some instances, the dummy bitline collision circuitry 118 may provide the dummy bitline collision signal (NDBL_Coll) as a row tracking signal that may be used to sense wire-to-wire variation between the dummy bitline (DBL) and the row tracking line (RTL). Also, in some implementations, the dummy bitline (DBL) coupling effects may be related to tracking wire-to-wire coupling-capacitance (CC) variation between the dummy bitline (DBL) and the row tracking line (RTL).

The row contention-detection circuitry 124 may receive the multi-port addresses from the address bus (ADDR_Bus), compare the first address from the first port (Port_A) with the second address from the second port (Port_B) and provide a row contention adjustment signal (rcas) based on comparison between the first address and the second address. Also, the row contention-detection circuitry 124 may receive a row contention-detection enable signal (RCD_EN) and then provide the row contention adjustment signal (rcas) based on the row contention-detection enable signal (RCD_EN) and the comparison between the first address and the second address. The row contention adjustment signal (rcas) may refer to a contention-adapted read-write pulse adjustment signal.

The contention-detection circuitry 104 may have dummy wordline collision circuitry 128 that receives the row contention adjustment signal (rcas), senses wire-to-wire variation related to dummy wordline (DWL) coupling effects and provides a dummy wordline collision signal (NDWL_Coll) based on sensing the dummy wordline (DWL) coupling effects. Also, in some instances, the dummy wordline collision circuitry 128 may receive the adjusted internal clock pulse (INT_CLK_ADJ) and provide the dummy wordline collision signal (NDWL_Coll) based on sensing the dummy wordline (DWL) coupling effects between the dummy wordline (DWL) and the column tracking line (CTL). Also, the sensed contention may refer to sensing coupling effects related to tracking wire-to-wire coupling-capacitance (CC) variation between the DWL and the CTL. The DWL may provide a dummy wordline turn signal (DWL_turn) that returns the DWL to the memory circuitry 112 for tracking other DWL sensing effects.

In some implementations, the memory circuitry 112 may receive the external clock pulse (EXT_CLK), receive the dummy wordline collision signal (NDWL_Coll) and adjust the internal clock pulse so as to provide the adjusted internal clock pulse (INT_CLK_ADJ) based on the dummy wordline collision signal (NDWL_Coll). The dummy wordline collision circuitry 128 may be coupled to the memory circuitry 112 with a column tracking line (CTL) that is disposed proximate (or near, or adjacent) to a dummy wordline (DWL) associated with the dummy wordline (DWL) coupling effects. The dummy wordline collision circuitry 128 may provide the dummy wordline collision signal (NDWL_Coll) as a column tracking signal that senses wire-to-wire variation between the dummy wordline (DWL) and the column tracking line (CTL). The dummy wordline (DWL) coupling effects may be related to tracking wire-to-wire coupling-capacitance (CC) variation between the dummy wordline (DWL) and the column tracking line (CTL).

Figure 2:
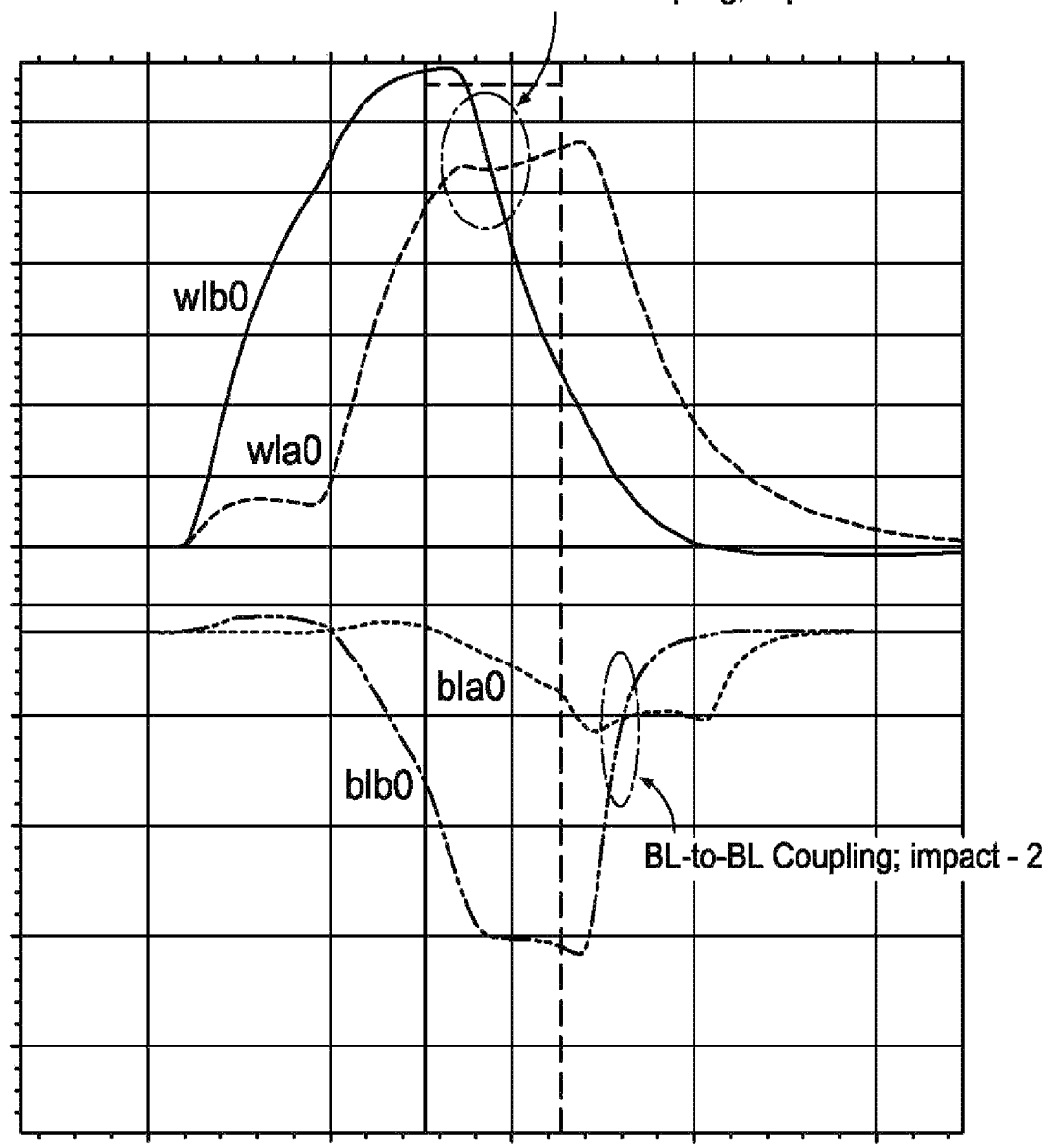
FIG. 2 illustrates a diagram of contention waveforms in accordance with various implementations described herein.

FIG. 2 illustrates a diagram 200 of contention waveforms 204 in accordance with various implementations described herein.

In reference to dual-port memory operations, row contention may exhibit wordline-to-wordline coupling effects that adversely impact read-read (RD-RD) memory accesses and read-write (RD-WR) memory accesses with an expectation of delayed read operations and/or delayed write operations, which results in reduced yield and PPA. Also, column contention may exhibit bitline-to-bitline coupling effects that also adversely impact read-read (RD-RD) memory accesses and read-write (RD-WR) memory accesses with an expectation of delayed read operations, which may also result in reduced yield and PPA. Moreover, full row/column contention may exhibit wordline-to-wordline coupling effects and/or bitline-to-bitline coupling effects that adversely impact read-read (RD-RD) memory accesses with an expectation of delayed read operations, which may also result in reduced yield and PPA.

As shown in FIG. 2, the contention waveforms 204 show an asynchronous clock applied to the contention-adapted read-write pulse generation circuitry 104 so as to provide graphical representations of wordline-to-wordline (WL-to-WL) coupling effects (impact-1) and bitline-to-bitline (BL-to-BL) coupling effects (impact-2).

In reference to WL-to-WL coupling effects (impact-1), the contention waveforms 204 show row contention when the wla0 waveform crosses the wlb0 waveform. The dual port configuration (Port_A, Port_B) of the memory associates the first port (Port_A) with the first wordline (wla0) and also associates the second port (Port_B) with the second wordline (wlb0). As shown in FIG. 2, when wlb0 falls, contention may occur at the point where wlb0 crosses wla0, which may adversely impact memory access operations.

In reference to BL-to-BL coupling effects (impact-2), the contention waveforms 204 show column contention when the bla0 waveform crosses the blb0 waveform. The dual port configuration (Port_A, Port_B) of the memory associates the first port (Port_A) with the first bitline (bla0) and also associates the second port (Port_B) with the second bitline (blb0). As shown in FIG. 2, when bla0 falls, contention may occur at the point where bla0 crosses blb0, which may adversely impact memory access operations.

In various implementations, the contention-adapted read-write pulse generation schemes and techniques described herein provide for contention detection spatially based on physical addresses as well as temporally based on dual-port clock overlap. As described herein, timing impact due to collision may be tracked across a compiler range, which limits performance degradation and adapts to memory size of rows/columns. Also, based on type of contention (e.g., row or column or both), the STP circuit may be configured to adapt to an applicable coupling mode and then adjust a memory-internal read/write pulse. As described herein, the novel circuitry shown in FIG. 1 provides for a high-level scheme and technique that provides for contention-adapted read-write pulse adjustment.

FIG. 3 illustrates a process flow diagram of a method 300 for providing column contention-detection circuitry in accordance with implementations described herein. In some implementations, method 300 may be configured to provide row tracking capability with use of the column contention-detection circuitry.

It should be understood that even though method 300 indicates a particular order of operation execution, in some cases, various portions of operations may be executed in a different order, and on different systems. In other cases, additional operations and/or steps may be added to and/or omitted from method 300. Also, method 300 may be implemented in hardware and/or software. For instance, if implemented in hardware, method 300 may be implemented with various components and/or circuitry, as described in FIGS. 1-2. Also, in other instances, if implemented in software, method 300 may be implemented as a program or software instruction process configured for providing contention-detection circuitry, as described herein. Also, in other instances, if implemented in software, instructions related to implementing method 300 may be stored in memory and/or a database. Therefore, in various implementations, a computer or various other types of computing devices with a processor and memory may be configured to perform method 300.

As described in reference to FIG. 3, the method 300 may be used for fabricating and/or manufacturing, or causing to be fabricated and/or manufactured, an integrated circuit (IC) that implements various layout schemes and techniques in physical design as described herein so as to thereby provide contention-detection circuitry using various related devices, components and/or circuitry as described herein.

At block 310, method 300 may use an address bus to provide multi-port addresses from multiple ports including, e.g., a first address from a first port and a second address from a second port. At block 320, method 300 may provide column contention-detection circuitry to receive the multi-port addresses from the address bus, compare the first address from the first port with the second address from the second port and provide a contention adjustment signal based on the comparison between the first address and the second address. In some implementations, the column contention-detection circuitry receives a contention-detection enable signal and then provides the contention adjustment signal based on the contention-detection enable signal and comparison between the first address and the second address. Also, in some implementations, the contention adjustment signal may refer to a contention-adapted read-write pulse adjustment signal.

At block 330, method 300 may provide bitline collision circuitry to receive the contention adjustment signal, sense wire-to-wire variation related to bitline coupling effects and provide a bitline collision signal based on sensing the bitline coupling effects. In some implementations, the bitline collision circuitry receives an internal clock and provides the bitline collision signal based on sensing the bitline coupling effects. In some instances, the bitline may refer to a dummy bitline (DBL).

At block 340, method 300 may provide memory circuitry to receive an external clock pulse, receive the bitline collision signal and adjust an internal clock pulse based on the bitline collision signal. In some implementations, the bitline collision circuitry is coupled to the memory circuitry with a tracking line that is disposed proximate to a bitline associated with the bitline coupling effects. The bitline collision circuitry may provide the bitline collision signal as a row tracking signal that senses wire-to-wire variation between the bitline and the tracking line. The bitline coupling effects may be related to tracking wire-to-wire coupling-capacitance variation between the bitline and the tracking line.

FIG. 4 illustrates a process flow diagram of a method 400 for providing row contention-detection circuitry in accordance with implementations described herein. In some implementations, method 400 may be configured to provide column tracking capability with use of the row contention-detection circuitry.

It should be understood that even though method 400 indicates a particular order of operation execution, in some cases, various portions of operations may be executed in a different order, and on different systems. In other cases, additional operations and/or steps may be added to and/or omitted from method 400. Also, method 400 may be implemented in hardware and/or software. For instance, if implemented in hardware, method 400 may be implemented with various components and/or circuitry, as described in FIGS. 1-2. Also, in other instances, if implemented in software, method 400 may be implemented as a program or software instruction process configured for providing contention-detection circuitry, as described herein. Also, in other instances, if implemented in software, instructions related to implementing method 400 may be stored in memory and/or a database. Therefore, in various implementations, a computer or various other types of computing devices with a processor and memory may be configured to perform method 400.

As described in reference to FIG. 4, the method 400 may be used for fabricating and/or manufacturing, or causing to be fabricated and/or manufactured, an integrated circuit (IC) that implements various layout schemes and techniques in physical design as described herein so as to thereby provide contention-detection circuitry using various related devices, components and/or circuitry as described herein.

At block 410, method 400 may use an address bus to provide multi-port addresses from multiple ports including, e.g., a first address from a first port and a second address from a second port. At block 420, method 400 may provide row contention-detection circuitry to receive the multi-port addresses from the address bus, compare the first address from the first port with the second address from the second port and provide a contention adjustment signal based on the comparison between the first address and the second address. The row contention-detection circuitry may receive a contention-detection enable signal and provide the contention adjustment signal based on the contention-detection enable signal and the comparison between the first address and the second address. The contention adjustment signal may refer to a contention-adapted read-write pulse adjustment signal.

At block 430, method 400 may provide wordline collision circuitry to receive the contention adjustment signal, sense wire-to-wire variation related to wordline coupling effects and provide a wordline collision signal based on sensing the wordline coupling effects. Also, the wordline collision circuitry may receive an internal clock pulse and provide the wordline collision signal based on sensing the wordline coupling effects. In some instances, the wordline may refer to a dummy wordline (DWL).

At block 440, method 400 may provide memory circuitry to receive an external clock pulse, receive the wordline collision signal and adjust an internal clock pulse based on the wordline collision signal. The wordline collision circuitry may be coupled to the memory circuitry with a tracking line that is disposed proximate to a wordline associated with the wordline coupling effects. The wordline collision circuitry may provide the wordline collision signal as a row tracking signal that senses wire-to-wire variation between the wordline and the tracking line. Also, the wordline coupling effects may be related to tracking wire-to-wire coupling-capacitance variation between the wordline and the tracking line.

The various implementations described herein may provide for benefits associated with one or more of the following features, behaviors and/or characteristics. For instance, the schemes and techniques described herein may provide for tracking the source of issue associated with wire-to-wire coupling effects by tracking various in coupling capacitance of wordlines and bitlines. Also, PPA across the compiler space may be optimized as coupling effects along wordlines and bitlines are tracked with memory size changes. Also, there may be saving in dynamic power usage due to tracked self-timing pulse (STP) as needed, wherein if a designer selects 2 CLKs (CLKA, CLKB) with a skew so as to avoid temporal contention, the novel circuitry may not increase pulse and benefits from improved PPA.

It should be intended that the subject matter of the claims not be limited to various implementations and/or illustrations provided herein, but should include any modified forms of those implementations including portions of implementations and combinations of various elements in reference to different implementations in accordance with the claims. It should also be appreciated that in development of any such implementation, as in any engineering or design project, numerous implementation-specific decisions should be made to achieve developers' specific goals, such as, e.g., compliance with system-related constraints and/or business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device with an address bus that provides multi-port addresses from multiple ports including a first address from a first port and a second address from a second port. The device may have column contention-detection circuitry that receives the multi-port addresses from the address bus, compares the first address from the first port with the second address from the second port and provides a contention adjustment signal based on the comparison between the first address and the second address. The device may have bitline collision circuitry that receives the contention adjustment signal, senses wire-to-wire variation related to bitline coupling effects and provides a bitline collision signal based on sensing the bitline coupling effects.

Described herein are various implementations of a device with an address bus that provides multi-port addresses from multiple ports including a first address from a first port and a second address from a second port. The device may have row contention-detection circuitry that receives the multi-port addresses from the address bus, compares the first address from the first port with the second address from the second port and provides a contention adjustment signal based on the comparison between the first address and the second address. The device may have wordline collision circuitry that receives the contention adjustment signal, senses wire-to-wire variation related to wordline coupling effects and provides a wordline collision signal based on sensing the wordline coupling effects.

Described herein are various implementations of a device with first contention-detection circuitry that receives multi-port addresses from an address bus, compares the multi-port addresses and provides a first adjustment signal based on the comparison between the multi-port addresses. The device may have second contention-detection circuitry that receives the multi-port addresses from the address bus, compares the multi-port addresses and provides a second adjustment signal based on the comparison between the multi-port addresses. The device may have first collision circuitry that receives the first adjustment signal, senses variation related to bitline coupling effects and provides a bitline collision signal based on sensing the bitline coupling effects. The device may have second collision circuitry that receives the second adjustment signal, senses variation related to wordline coupling effects and provides a wordline collision signal based on sensing the wordline coupling effects.

Reference has been made in detail to various implementations, examples of which are illustrated in accompanying drawings and figures. In the following detailed description, numerous specific details are set forth to provide a thorough understanding of the disclosure provided herein. However, the disclosure provided herein may be practiced without these specific details. In various implementations, well-known methods, procedures, components, circuits and networks have not been described in detail so as not to unnecessarily obscure details of the embodiments.

It should also be understood that, although various terms first, second, etc. may be used herein to describe various elements, these elements should not be limited by these terms. These terms are only used to distinguish one element from another. For instance, a first element could be termed a second element, and, similarly, a second element could be termed a first element. Also, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and various other similar terms that indicate relative positions above or below a given point or element may be used in connection with various implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, specific features and/or acts described above are disclosed as example forms of implementing the claims.

What is claimed is:

1. A device, comprising:
    an address bus that provides multi-port addresses from multiple ports including a first address from a first port and a second address from a second port;
    column contention-detection circuitry that receives the multi-port addresses from the address bus, compares the first address from the first port with the second address from the second port and provides a contention adjustment signal based on the comparison between the first address and the second address; and
    bitline collision circuitry that receives the contention adjustment signal, senses wire-to-wire variation related to bitline coupling effects and provides a bitline collision signal based on sensing the bitline coupling effects.

2. The device of claim 1, wherein the column contention-detection circuitry receives a contention-detection enable signal and provides the contention adjustment signal based on the contention-detection enable signal and the comparison between the first address and the second address.

3. The device of claim 1, wherein the contention adjustment signal refers to a contention-adapted read-write pulse adjustment signal.

4. The device of claim 1, wherein the bitline collision circuitry receives an internal clock pulse and provides the bitline collision signal based on sensing the bitline coupling effects.

5. The device of claim 4, further comprising:
    memory circuitry that receives an external clock pulse, receives the bitline collision signal and adjusts the internal clock pulse based on the bitline collision signal.

6. The device of claim 5, wherein:
    the bitline collision circuitry is coupled to the memory circuitry with a tracking line that is disposed proximate to a bitline associated with the bitline coupling effects,
    the bitline collision circuitry provides the bitline collision signal as a row tracking signal that senses wire-to-wire variation between the bitline and the tracking line, and
    the bitline coupling effects are related to tracking wire-to-wire coupling-capacitance variation between the bitline and the tracking line.

7. A device, comprising:
    an address bus that provides multi-port addresses from multiple ports including a first address from a first port and a second address from a second port;
    row contention-detection circuitry that receives the multi-port addresses from the address bus, compares the first address from the first port with the second address from the second port and provides a contention adjustment signal based on the comparison between the first address and the second address; and
    wordline collision circuitry that receives the contention adjustment signal, senses wire-to-wire variation related to wordline coupling effects and provides a wordline collision signal based on sensing the wordline coupling effects.

8. The device of claim 7, wherein the row contention-detection circuitry receives a contention-detection enable signal and provides the contention adjustment signal based on the contention-detection enable signal and the comparison between the first address and the second address.

9. The device of claim 7, wherein the contention adjustment signal refers to a contention-adapted read-write pulse adjustment signal.

10. The device of claim 7, wherein the wordline collision circuitry receives an internal clock pulse and provides the wordline collision signal based on sensing the wordline coupling effects.

11. The device of claim 10, further comprising:
    memory circuitry that receives an external clock pulse, receives the wordline collision signal and adjusts the internal clock pulse based on the wordline collision signal.

12. The device of claim 11, wherein:
    the wordline collision circuitry is coupled to the memory circuitry with a tracking line that is disposed proximate to a wordline associated with the wordline coupling effects,
    the wordline collision circuitry provides the wordline collision signal as a column tracking signal that senses wire-to-wire variation between the wordline and the tracking line, and
    the wordline coupling effects are related to tracking wire-to-wire coupling-capacitance variation between the wordline and the tracking line.

13. A device, comprising:
    first contention-detection circuitry that receives multi-port addresses from an address bus, compares the multi-port addresses and provides a first adjustment signal based on the comparison between the multi-port addresses;
    second contention-detection circuitry that receives the multi-port addresses from the address bus, compares the multi-port addresses and provides a second adjustment signal based on the comparison between the multi-port addresses;
    first collision circuitry that receives the first adjustment signal, senses variation related to bitline coupling effects and provides a bitline collision signal based on sensing the bitline coupling effects; and
    second collision circuitry that receives the second adjustment signal, senses variation related to wordline coupling effects and provides a wordline collision signal based on sensing the wordline coupling effects.

14. The device of claim 13, further comprising:
    an address bus that provides multi-port addresses from multiple ports including a first address from a first port and a second address from a second port.

15. The device of claim 14, wherein:
the first contention-detection circuitry refers to column contention-detection circuitry that receives the multi-port addresses from the address bus, compares the first address from the first port with the second address from the second port and provides the first adjustment signal as a first contention adjustment signal based on the comparison between the first address and the second address; and
the first collision circuitry refers to bitline collision circuitry that receives the first contention adjustment signal, senses wire-to-wire variation related to the bitline coupling effects and provides the bitline collision signal based on sensing the bitline coupling effects.

16. The device of claim 14, wherein:
the second contention-detection circuitry refers to row contention-detection circuitry that receives the multi-port addresses from the address bus, compares the first address from the first port with the second address from the second port and provides the second adjustment signal as a second contention adjustment signal based on the comparison between the first address and the second address; and
the second collision circuitry refers to wordline collision circuitry that receives the second contention adjustment signal, senses wire-to-wire variation related to wordline coupling effects and provides the wordline collision signal based on sensing the wordline coupling effects.

17. The device of claim 13, further comprising:
memory circuitry that receives an external clock pulse, receives the bitline collision signal, receives the wordline collision signal and adjusts an internal clock pulse based on the bitline collision signal and the wordline collision signal.

18. The device of claim 17, wherein:
the first collision circuitry is coupled to the memory circuitry with a first tracking line that is disposed proximate to a bitline associated with the bitline coupling effects,
the first collision circuitry provides the bitline collision signal as a row tracking signal that senses wire-to-wire variation between the bitline and the first tracking line, and
the bitline coupling effects are related to tracking wire-to-wire coupling-capacitance variation between the bitline and the first tracking line.

19. The device of claim 17, wherein:
the second collision circuitry is coupled to the memory circuitry with a second tracking line that is disposed proximate to a wordline associated with the wordline coupling effects,
the second collision circuitry provides the wordline collision signal as a column tracking signal that senses wire-to-wire variation between the wordline and the second tracking line, and
the wordline coupling effects are related to tracking wire-to-wire coupling-capacitance variation between the wordline and the second tracking line.

20. The device of claim 17, wherein:
the first adjustment signal refers to a first contention adjustment signal that is used by the memory circuitry as a first contention-adapted read-write pulse adjustment signal for adjusting the internal clock pulse, and
the second adjustment signal refers to a second contention adjustment signal that is used by the memory circuitry as a second contention-adapted read-write pulse adjustment signal for adjusting the internal clock pulse.

* * * * *